United States Patent
Mine et al.

(10) Patent No.: US 10,804,017 B2
(45) Date of Patent: Oct. 13, 2020

(54) FLEXIBILE SUPERCONDUCTING LEAD ASSEMBLY

(71) Applicant: GE Precision Healthcare LLC, Wauwatosa, WI (US)

(72) Inventors: Susumu Mine, Niskayuna, NY (US); Anbo Wu, Niskayuna, NY (US); Minfeng Xu, Niskayuna, NY (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 621 days.

(21) Appl. No.: 15/593,736

(22) Filed: May 12, 2017

(65) Prior Publication Data

US 2018/0330856 A1    Nov. 15, 2018

(51) Int. Cl.
*H01F 6/06* (2006.01)
*H01B 12/06* (2006.01)
(Continued)

(52) U.S. Cl.
CPC ....... *H01F 6/006* (2013.01); *G01R 33/34023* (2013.01); *G01R 33/36* (2013.01);
(Continued)

(58) Field of Classification Search
None
See application file for complete search history.

(56) References Cited

U.S. PATENT DOCUMENTS

| | | | |
|---|---|---|---|
| 6,034,324 A | 3/2000 | Dixon et al. | |
| 6,864,432 B2 | 3/2005 | Boettcher et al. | |

(Continued)

FOREIGN PATENT DOCUMENTS

| | | |
|---|---|---|
| CN | 102903454 A | 1/2013 |
| CN | 103210455 A | 7/2013 |

(Continued)

OTHER PUBLICATIONS

Extended European Search Report and Opinion issued in connection with corresponding EP Application No. 18170618.5 dated Sep. 27, 2018, 9 pages.

(Continued)

*Primary Examiner* — Colleen P Dunn (74) *Attorney, Agent, or Firm* — Armstrong Teasdale LLP (57) ABSTRACT

There is set forth herein a superconducting lead assembly comprising: a positive superconducting wire; a negative superconducting wire, wherein the positive superconducting wire is configured to conduct inflow current to a cryogenic apparatus and wherein the negative superconducting wire is configured to conduct outflow current away from the cryogenic apparatus; and an electrically insulating separator, wherein the positive superconducting wire and the negative superconducting wire are arranged proximately one another and on opposite sides of the electrically insulating separator for cancellation of electromagnetic forces attributable to current flowing simultaneously in opposite directions within the positive superconducting wire and the negative superconducting wire, and wherein a length of the superconducting lead assembly is flexible. In one embodiment the positive superconducting wire and the negative superconducting wire can include high temperature superconducting (HTS) material.

18 Claims, 8 Drawing Sheets

(51) Int. Cl.
*H01L 39/12* (2006.01)
*H01L 39/24* (2006.01)
*H01F 6/00* (2006.01)
*H01B 7/04* (2006.01)
*H02G 15/34* (2006.01)
*G01R 33/34* (2006.01)
*G01R 33/36* (2006.01)
*H01F 6/04* (2006.01)
*G01R 33/3815* (2006.01)

(52) U.S. Cl.
CPC ............... *H01B 7/04* (2013.01); *H01B 12/06* (2013.01); *H01F 6/04* (2013.01); *H01F 6/06* (2013.01); *H01F 6/065* (2013.01); *H01L 39/126* (2013.01); *H01L 39/2419* (2013.01); *H02G 15/34* (2013.01); *G01R 33/3815* (2013.01)

(56) References Cited

U.S. PATENT DOCUMENTS

| | | | |
|---|---|---|---|
| 2008/0179070 A1 | 7/2008 | Gouge et al. | |
| 2008/0180202 A1 | 7/2008 | Otto et al. | |
| 2009/0212891 A1 | 8/2009 | Hickman | |
| 2012/0065074 A1* | 3/2012 | Xie | H01R 4/68 505/234 |
| 2013/0190183 A1* | 7/2013 | Stemmle | H01B 12/02 505/163 |
| 2014/0028316 A1* | 1/2014 | Mine | G01R 33/3815 324/318 |
| 2015/0018221 A1 | 1/2015 | van der Laan | |
| 2017/0092392 A1 | 3/2017 | Driscoll et al. | |

FOREIGN PATENT DOCUMENTS

| | | |
|---|---|---|
| CN | 103578682 A | 2/2014 |
| GB | 2476716 A | 7/2011 |
| JP | H0435146 A | 2/1992 |
| JP | H10112407 A | 4/1998 |
| JP | 2000251547 A | 9/2000 |
| JP | 3536230 B2 | 6/2004 |
| JP | 2008251564 A | 10/2008 |
| JP | 2011024802 A | 2/2011 |
| JP | 2012235008 A | 11/2012 |
| JP | 2013143474 A | 7/2013 |
| JP | 2013543631 A | 12/2013 |
| JP | 2014027273 A | 2/2014 |
| JP | 2015204338 A | 11/2015 |
| KR | 2013014396 A | 2/2013 |
| KR | 2013107301 A | 10/2013 |
| WO | 2016047909 A1 | 3/2016 |
| WO | 2016124276 A1 | 8/2016 |

OTHER PUBLICATIONS

Wolf et al., Investigation of HTS Cross Conductor Joints, Connectors and Terminations, Publication, Jan. 11, 2017, 1 page, vol. PP, Issue: 99.

Maruyama et al., Development of 66 kV and 275 kV Class REBCO HTS Power Cables, Publication, pp. 1-5, Jun. 2013, vol. 23, Issue: 3.

AZO Materials, High Temperature Superconducting Transmission Cables, Publication, Oct. 11, 2011, pp. 1-8, http://www.azon.com/article.aspx?Article=942.

Canavan et al., Cryogenics, The Astro-H High Temperature Superconductor Lead Assemblies, Publication, pp. 194-200, Jun. 27, 2014.

Japanese Office Action, Japanese Patent Application No. 2018-09113, dated Oct. 29, 2019.

Chinese Search Report, Chinese Patent Application No. 2018104497312, dated Jan. 4, 2019.

Chinese Office Action, Chinese Patent Application No. 2018104497312, dated Oct. 4, 2019.

Chinese Search Report, Chinese Patent Application No. 2018104497312, dated Nov. 26, 2019.

Korean Office Action, Korean Patent Application No. 10-2018-0054236, dated Apr. 15, 2019.

* cited by examiner

FLEXIBILE SUPERCONDUCTING LEAD ASSEMBLY

BACKGROUND

Very low temperatures are used to enable superconducting material to exhibit superconducting properties. Power can be supplied to a cryogenic apparatus operating at a cryogenic temperatures with power sources often at room temperature, (about 300° K) using first and second superconducting wires. In order to drop the temperature of a superconducting wire to the operating range of the low temperature cryogenic apparatus (which is typically about 4° K) and then maintain that temperature, cooled gas or cryogenic liquid is often used. This is because the large currents that the superconducting wires generate heat at their end terminals due to their resistive properties. Superconducting wires can reduce the heat generated by these large currents with appropriate mechanical design features, but instabilities and heat leaks from the material can still occur.

Superconducting wires can include superconducting material having an associated critical temperature, $T_c$, below which the superconducting material becomes superconducting. Superconducting wires can be used in a variety of environments having cryogenic apparatus. Cryogenic apparatus can include e.g. superconducting magnets, motors, generators, fault current limiters, energy storage apparatus, particle accelerators, middle scale magnets, and lab use magnets. Magnetic resonance imaging (MRI) systems operate with superconducting magnets. Typically, an MRI system has a superconducting magnet to generate a basic magnetic field ($B_O$).

BRIEF DESCRIPTION

There is set forth herein a cryogenic system comprising a vessel containing a cryogenic apparatus; and a superconducting lead assembly having a positive superconducting wire disposed within the vessel and a negative superconducting wire disposed within the vessel, wherein the positive superconducting wire is an inflow superconducting wire conducting inflow current to the cryogenic apparatus and wherein the negative superconducting wire is an outflow superconducting wire conducting outflow current away from the cryogenic apparatus, wherein the superconducting lead assembly includes an electrically insulating separator, and wherein the positive superconducting wire and the negative superconducting wire are arranged proximately one another and on opposite sides of the electrically insulating separator to cancel electromagnetic forces attributable to current flowing simultaneously in opposite directions within the positive superconducting wire and the negative superconducting wire. In one embodiment the positive superconducting wire and the negative superconducting wire can include high temperature superconducting (HTS) material.

There is also set forth herein a cryogenic system comprising a vessel containing a cryogenic apparatus; and a superconducting lead assembly having a positive superconducting wire disposed within the vessel and a negative superconducting wire disposed within the vessel, wherein the positive superconducting wire is an inflow superconducting wire conducting inflow current to the cryogenic apparatus and wherein the negative superconducting wire is an outflow superconducting wire conducting outflow current away from the cryogenic apparatus, wherein the superconducting lead assembly includes an electrically insulating separator, and wherein the positive superconducting wire and the negative superconducting wire are arranged proximately one another and on opposite sides of the electrically insulating separator to cancel electromagnetic forces attributable to current flowing simultaneously in opposite directions within the positive superconducting wire and the negative superconducting wire so that the superconducting lead assembly remains in a stationary position while simultaneously conducting inflow and outflow current, wherein a length of the superconducting lead assembly is flexible and wherein the superconducting lead assembly is in a bended configuration within the vessel. In one embodiment the positive superconducting wire and the negative superconducting wire can include high temperature superconducting (HTS) material.

There is also set forth herein a superconducting lead assembly comprising: a positive superconducting wire; a negative superconducting wire, wherein the positive superconducting wire is configured to conduct inflow current to a cryogenic apparatus and wherein the negative superconducting wire is configured to conduct outflow current away from the cryogenic apparatus; and an electrically insulating separator, wherein the positive superconducting wire and the negative superconducting wire are arranged proximately one another and on opposite sides of the electrically insulating separator for cancellation of electromagnetic forces attributable to current flowing simultaneously in opposite directions within the positive superconducting wire and the negative superconducting wire, and wherein a length of the superconducting lead assembly is flexible. In one embodiment the positive superconducting wire and the negative superconducting wire can include high temperature superconducting (HTS) material.

There is also set forth herein a method comprising: installing a superconducting lead assembly within a vessel of a cryogenic system having a cryogenic apparatus, the superconducting lead assembly having a positive superconducting wire and a negative superconducting wire, wherein the positive superconducting wire is configured to conduct inflow current to a cryogenic apparatus and wherein the negative superconducting wire is configured to conduct outflow current away from the cryogenic apparatus, and an electrically insulating separator, wherein the positive superconducting wire and the negative superconducting wire are arranged proximately one another about the electrically insulating separator for cancellation of electromagnetic forces attributable to current flowing simultaneously in opposite directions within the positive superconducting wire and the negative superconducting wire, wherein a length of the superconducting lead assembly is flexible, wherein the installing includes connecting the superconducting lead assembly to the cryogenic apparatus for supply of current from a power supply to the cryogenic apparatus and bending the superconducting lead assembly into a bended configuration; and supplying power from the power supply to energize the cryogenic apparatus using the superconducting lead assembly, the supplying power including simultaneously conducting inflow current through the positive superconducting wire and outflow current through the negative superconducting wire. In one embodiment the positive superconducting wire and the negative superconducting wire can include high temperature superconducting (HTS) material.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Cryogenic apparatus use wires which feed electric current from a power supply typically at room temperature to cryogenic apparatus at low temperature. A cryogenic apparatus supplied with current using a wire can include e.g. one or more of a superconducting magnet, motor, generator, fault current limiter, energy storage device, particle accelerator, middle scale magnet, lab use magnet, or transformer.

Embodiments herein recognize that conducting wires including superconducting wires are susceptible to iterative movement resulting from electromagnetic forces known as Lorentz forces that are attributable to current flowing through a conducting wire. Lorentz forces can iteratively move a conducting wire when current flows through the conducting wire. Embodiment herein recognize that the iterative movement can yield instabilities or inconsistencies in a variety of operating environments including operating environments featuring a generated magnetic field.

In some embodiments, rigid support structure can be included with a superconducting lead assembly to oppose iterative movement of a superconducting wire resulting from electromagnetic forces attributed to current flowing through a superconducting wire. Embodiments herein recognize problems associated to the approach of including a rigid support structure to a superconducting wire. For example, the use of a rigid support structure can add significant design and manufacturing cost associated with a cryogenic system. Tighter tolerances may be needed for fitting together of rigid component parts, and routing of rigid component parts through a system characterized by multiple fixed position components.

Some commercially available superconducting wires have a combination of superconducting material and non-superconducting material e.g. can include conductive protective layer surrounding a superconducting layer formed of superconducting material. The non-superconducting material can provide mechanical support and can enhance system reliability (e.g. the superconducting wire can continue to conduct electrical current in the event of a quench). Embodiments herein recognize that non-superconducting material of a superconducting wire, while providing advantages, can be thermally conductive and can conduct unwanted heat toward a cryogenic apparatus.

Figure 1:
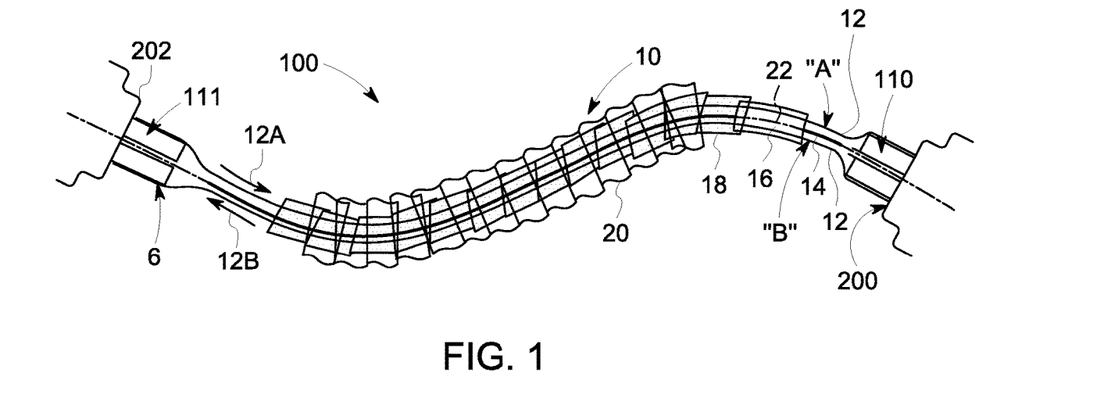
FIG. 1 is a perspective view of a lead assembly having positive and negative superconducting wires according to one embodiment.

FIG. 1 is a schematic diagram illustrating a superconducting lead assembly 10. In one embodiment, superconducting lead assembly 10 can include an elongated positive superconducting wire 12 e.g. at "A", a second elongated superconducting wire 12 e.g. at "B", an electrically insulating separator 14, bonding material 16, a cover assembly 18, and a protective tube 20. Superconducting lead assembly 10 can be adapted to supply current to a cryogenic apparatus. A superconducting wire 12 as set forth herein can be provided in one embodiment e.g. by a length of high temperature superconducting (HTS) wire. In one embodiment a superconducting wire 12 as set forth herein can be provided by a length of flat shaped high temperature superconducting wire, commonly referred to as HTS tape.

In one embodiment, superconducting lead assembly 10 can be included within a cryogenic system 100 and can be used to carry electrical current into and away from a cryogenic apparatus 200. Cryogenic apparatus 200 can include e.g. one or more of a superconducting magnet, motor, generator, fault current limiter, energy storage device, particle accelerator, middle scale magnet, lab use magnets, or transformer. A cryogenic apparatus 200 can include one or more current terminal assembly 110 as shown in FIG. 1 having inflow and outflow current terminals. Positive superconducting wire 12 carrying an electrical current toward cryogenic apparatus 200 e.g. along path 12A, can be connected to an inflow current terminal of current terminal assembly 110 and negative superconducting wire 12 which can carry current e.g. along path 12B away from cryogenic apparatus can be connected to an outflow current terminal of current terminal assembly 110.

As shown in FIG. 1, superconducting lead assembly 10 can include a first end connected to current terminal assembly 110 and a second end connected to current terminal assembly 111. Current terminal assembly 111 can be included on a component 202 of cryogenic system 100 spaced apart from cryogenic apparatus 200. Positive superconducting wire 12 at "A' can be connected to an outflow current terminal of current terminal assembly 111. Negative superconducting wire 12 at "B' can be connected to an inflow current terminal of current terminal assembly 111.

Within cryogenic system 100, cryogenic apparatus 200 can be colder than component 202. Superconducting lead assembly 10 can extend to a cold area of a cryogenic system 100, e.g. to cryogenic apparatus 200 from a relatively warmer area, e.g. from component 202 of cryogenic system 100 as shown. Accordingly the first end of superconducting lead assembly 10 can be regarded as a cold side of superconducting lead assembly 10 and the second end of superconducting lead assembly 10 can be regarded as a warm side of superconducting lead assembly 10.

In one embodiment, superconducting lead assembly 10 can be configured to be flexible throughout its length. Superconducting lead assembly 10 can have a centerline 22 that is curved when superconducting lead assembly 10 is in a bended configuration as shown in FIG. 1. Centerline 22 can be straight and coextensive with a straight longitudinal axis of superconducting lead assembly 10 when superconducting lead assembly 10 is in a straightened configuration. In one embodiment, superconducting lead assembly 10 can be flexible throughout its length permitting bending of superconducting lead assembly 10, thus permitting centerline 22 to be curved when superconducting lead assembly 10 is in a bended configuration.

Figure 2:
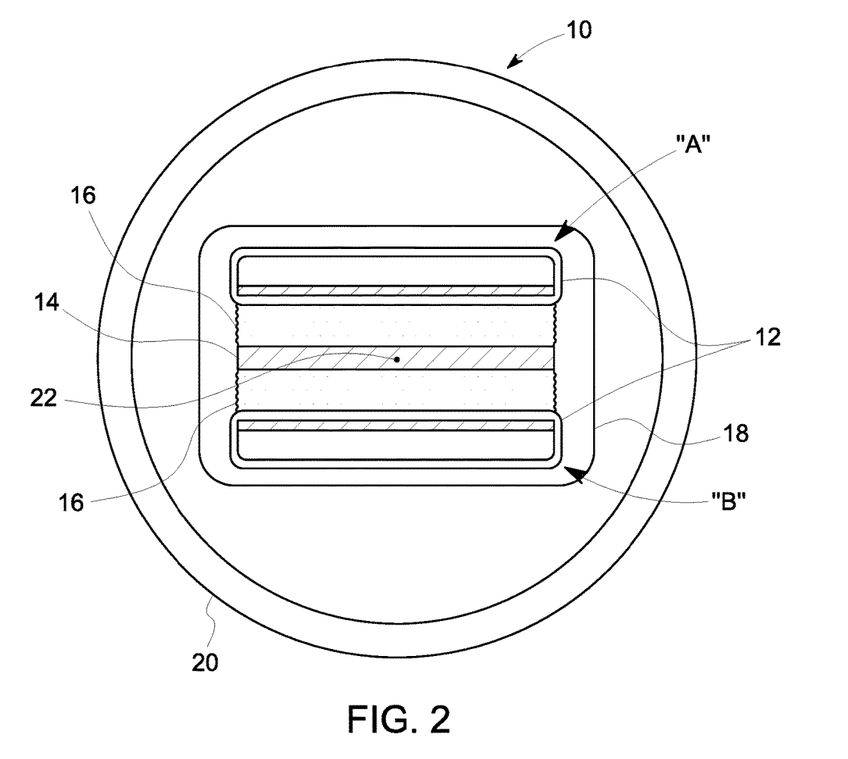
FIG. 2 is a front cross sectional view of a lead assembly having positive and negative superconducting wires according to one embodiment.
Figure 3:
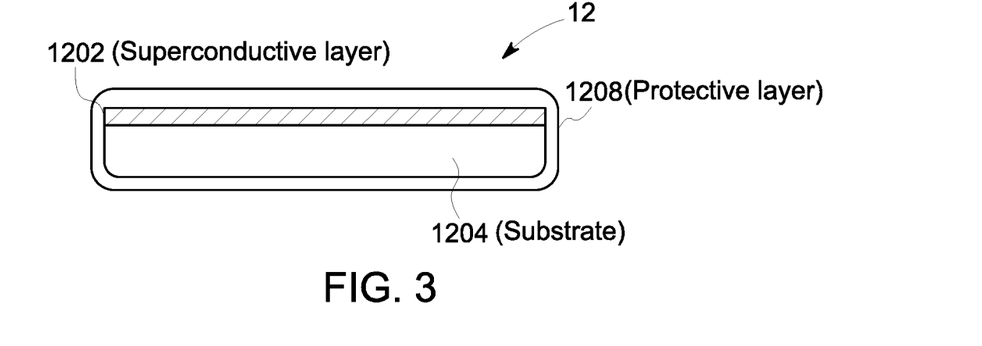
FIG. 3 is a front cross sectional view illustrating a superconducting wire according to one embodiment.

A front cross sectional view of superconducting lead assembly 10 e.g. a view in parallel with centerline 22 is shown in FIG. 2. An enlarged cross sectional front view of superconducting wire 12, is shown in FIG. 3. Referring to FIGS. 2 and 3, superconducting layer 1202 of superconducting wire 12 can be formed of superconducting material. In one embodiment superconducting layer 1202 can be formed of a rare earth material e.g. a rare earth material such as GdBCO or yttrium barium copper oxide (YBCO). In one embodiment superconducting layer 1202 can be formed of copper oxide material e.g. Bi2Sr2Ca2Cu3O10 (BSCCO), or ReBa2Cu3O7 (ReBCO). Superconducting material can have a critical temperature ($T_C$) below which the superconducting material is superconducting. When a material becomes superconducting it exhibits zero resistivity. Superconducting layer 1202 of superconducting wire 12 in one embodiment can be formed of high temperature superconducting (HTS) material. In one embodiment, HTS material can have a critical temperature ($T_C$) of about 90° K or higher. In one embodiment, HTS material can have a critical temperature ($T_C$) in the temperature range of between about 90° K and about 120° K or higher.

As shown in FIGS. 2 and 3, superconducting layer 1202 can be surrounded by protective layer 1208. Protective layer 1208 can be provided by a silver or copper plating in one embodiment. Protective layer 1208 in one embodiment where provided by a silver or copper plating, can be formed e.g. by depositing silver or copper onto a structure having superconducting layer 1202. Depositing can be performed e.g. by chemical vapor deposition (CVD). Referring to FIG. 3 showing a structure of superconducting wire 12 in one specific embodiment, superconducting wire 12 can have fewer layers or can include alternative or additional layers e.g. formed on substrate 1204 there can be a buffer layer in one embodiment.

Figure 4:
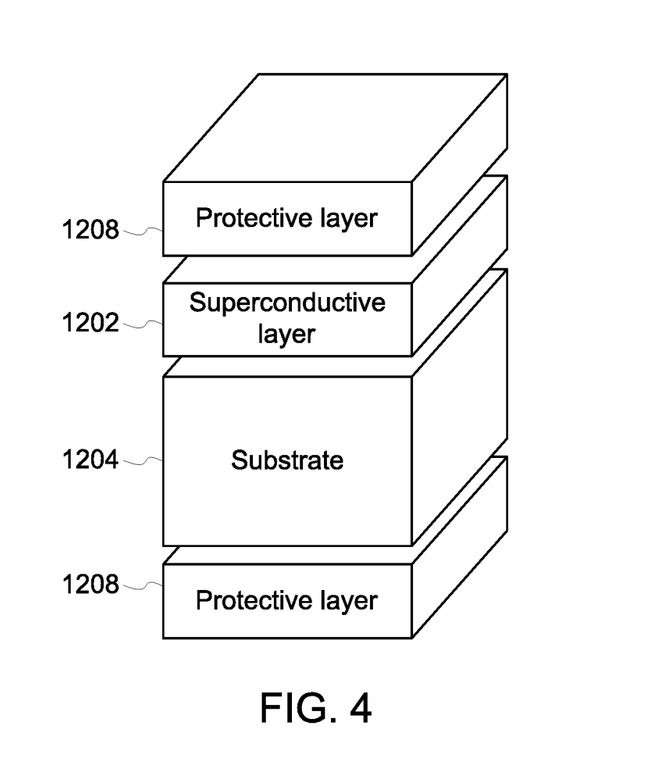
FIG. 4 is a cross sectional view illustrating layers of a superconducting wire according to one embodiment.

FIG. 4 illustrates an enlarged schematic cross sectional front view of superconducting wire 12 in one specific embodiment.

Referring to FIG. 4, substrate 1204 in one embodiment can be formed of nonmagnetic stainless steel. In one embodiment, substrate 1204 can have a thickness of about 50 to 200 micrometers. In one embodiment superconducting layer 1202 can be formed of superconducting material and can have a thickness of from about 1.0 micrometers to about 1.5 micrometers. Regarding additional layers of superconducting wire 12, superconducting wire 12 can include a protective layer 1208 provided by a silver (Ag) coating in one embodiment. Protective layer in an alternative embodiment can be formed of copper (Cu) or another conductive metal. Protective layer 1208 can be formed on substrate 1204, and superconducting layer 1202 in one embodiment. Protective layer 1208 can have a thickness of from about 0.5 to about 2.0 micrometers in one embodiment. Protective layer 1208 can be formed in one embodiment by depositing silver or copper onto a structure having superconducting layer 1202, and substrate 1204. Depositing can be performed e.g. by using CVD. In one embodiment, a buffer layer can be provided between substrate 1204 and superconducting layer 1202. Such a buffer layer where present can be selected for matching a crystalline structure of material forming superconducting layer 1202 and can be formed on substrate 1204 by depositing using CVD.

Figure 5:
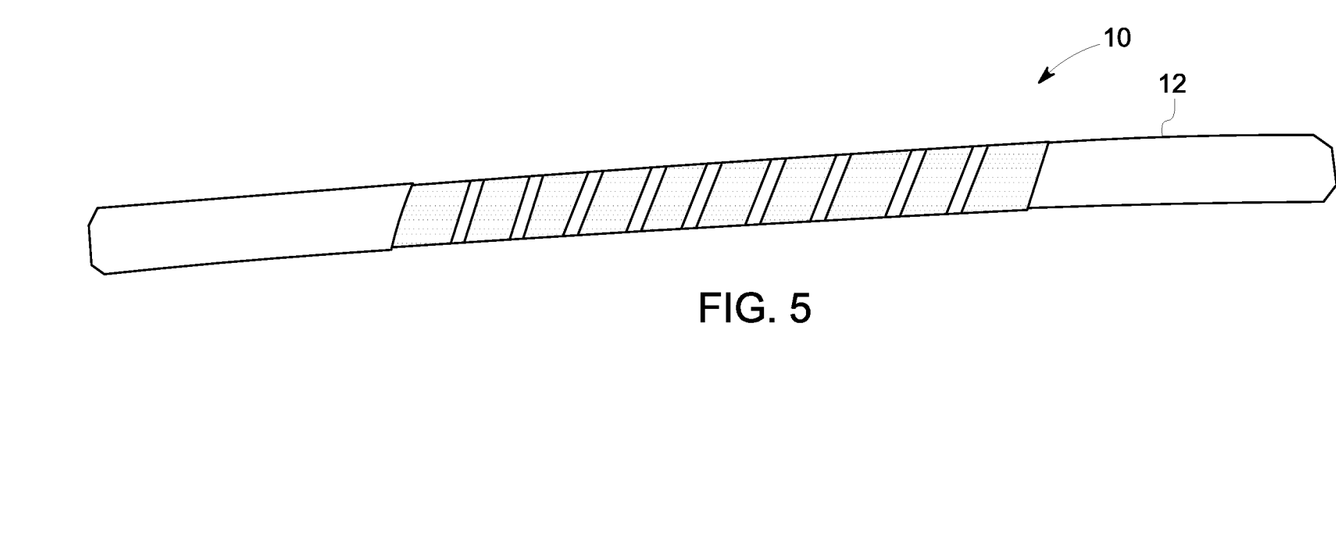
FIG. 5 is a top perspective view of a lead assembly according to one embodiment.
Figure 6:
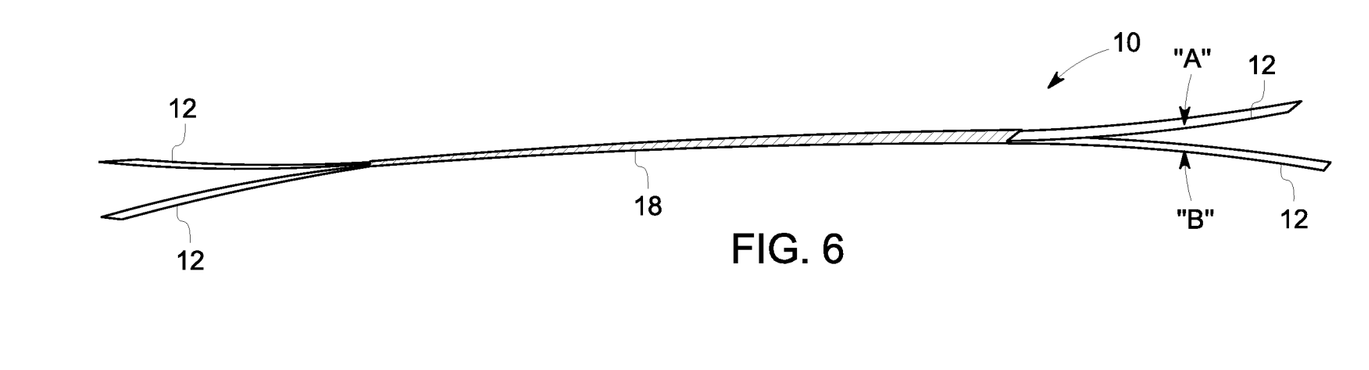
FIG. 6 is a side perspective view of a lead assembly according to one embodiment.
Figure 7:
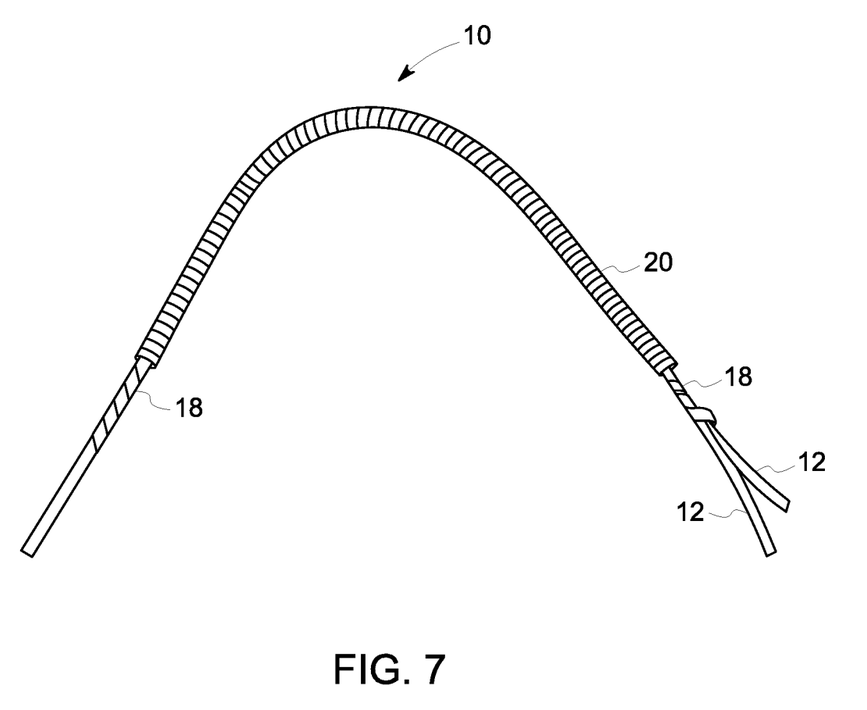
FIG. 7 is a perspective view of a lead assembly according to one embodiment.

Additional views of superconducting lead assembly 10 are shown in FIGS. 5, 6, and 7 which are referenced in connection with the views of FIGS. 1-4. As best seen in the views of FIGS. 1, 2, and 6 superconducting lead assembly 10 in one embodiment can include a positive superconducting wire 12 and a negative superconducting wire 12. Positive superconducting wire 12 at "A" can be provided to carry current along a first path 12A and negative superconducting wire 12 at "B" can be provided to simultaneously carry current along a second opposite path 12B as indicated in FIG. 1.

The positive and negative superconducting wires 12 can be separated by an electrically insulating separator 14 as best seen in FIG. 2. Electrically insulating separator 14 can be can be formed of dielectric material in one embodiment. In one embodiment, a positive superconducting wire 12 at location "A" can be disposed on a first side of electrically insulating separator 14 and a second superconducting wire 12 can be disposed at location "B" on an opposite side of electrically insulating separator 14. Positive superconducting wire 12, electrically insulating separator 14, and negative superconducting wire 12 can be bonded together using bonding material 16 which can be provided e.g. by an adhesive. The positive and negative superconducting wires at "A" and "B" can be symmetrically disposed about electrically insulating separator 14, which electrically insulating separator 14 can be centrally located. Symmetrical configuring of superconducting wires 12 at "A" and "B" about centrally disposed electrically insulating separator 14 can include features as are depicted in FIG. 2, including the feature depicted in FIG. 2 wherein respective superconducting layers 1202 of positive superconducting wire 12 at "A" and negative superconducting wire 12 at "B" oppose one another and are closer to electrically insulating separator 14 than respective substrates 1204 of positive superconducting wire 12 at "A" and negative superconducting wire 12 at "B". Further, each superconducting wire 12 at "A" and negative superconducting wire 12 at "B" can have common dimensions and the common dimensions can persist throughout a length of superconducting lead assembly 10. Each of positive superconducting wire 12 at "A" and negative superconducting wire at "B" and electrically insulating separator 14 can have an elongated configuration. Bonding material 16 can be used to fix the relative positions of superconducting wires 12 so that superconducting wires 12 are symmetrically disposed about electrically insulating separator 14. Symmetrical configuring of superconducting wires 12 at "A" and "B" about centrally disposed electrically insulating separator 14 encourages cancellation of Lorentz forces. Cover assembly 18 in one embodiment can be formed of a flexible insulator material such as a flexible dielectric material and can be formed to be spirally wound along a length of superconducting lead assembly 10 as shown in FIGS. 1, 6 and 7. Protective tube 20 in one embodiment can be formed of a rigid protective material and can be formed to be spirally wound along a length of superconducting lead assembly 10 as shown in FIG. 1.

In one embodiment positive superconducting wire 12 at "A" can be disposed in close proximity with negative superconducting wire 12 at "B," e.g. in one embodiment can be maintained at a separation distance of about 1.0 millimeter or less and can be separated by electrically insulating separator 14. In one embodiment, superconducting lead assembly 10 can be provided so that superconducting wires 12 have a separation distance of about 500 micrometers or less. In one embodiment, superconducting lead assembly 10 can be provided so that superconducting wires 12 have a separation distance of about 400 micrometers or less. In one embodiment, superconducting lead assembly 10 can be provided so that superconducting wires 12 have a separation distance of about 300 micrometers or less. If the separation is too thick, the flexibility of superconducting lead assembly 10 can be lost and the Lorentz force of two superconducting wires 12 will not cancel. If the separation is sufficiently thin, e.g. 1.0 millimeters or less in one embodiment, 500 micrometers or less in one embodiment, 400 micrometers or less in one embodiment, 300 micrometers or less in one embodiment, the superconducting lead assembly 10 will be flexible and Lorentz forces (electromagnetic forces) on both superconducting wires 12 at "A" and "B" will be of common value and of reversed direction, which means the cumulative electromagnetic force to superconducting lead assembly 10 will cancel.

With reference to the cross sectional view of FIG. 2 in connection with the views of FIGS. 1, 3-7, superconducting lead assembly 10 can be configured so that the symmetrical profile depicted by the cross sectional view of FIG. 2 characterized by superconducting wires 12 at "A" and "B" being symmetrically disposed about electrically insulating separator 14 persists throughout a length of superconducting lead assembly 10. Providing superconducting lead assembly 10 so that a symmetrical cross sectional profile as illustrated by the example of FIG. 2 persists through a length of superconducting lead assembly 10 can assure that electromagnetic force cancellation can be achieved throughout a length of superconducting lead assembly 10 and so that superconducting lead assembly 10 remains flexible throughout a length thereof. In one embodiment, superconducting lead assembly 10 can have a length of about 0.01 meters or longer. In one embodiment, superconducting lead assembly 10 can have a length of about 0.05 meters or longer. In one embodiment, superconducting lead assembly 10 can have a length of about 0.1 meters or longer. In one embodiment, superconducting lead assembly 10 can have a length of about 0.2 meters or longer. In one embodiment, superconducting lead assembly 10 can have a length of about 0.5 meters or longer. In one embodiment, superconducting lead assembly 10 can have a length of about 1.0 meters or longer. In one embodiment, superconducting lead assembly 10 can have a length of about 2.0 meters or longer.

Figure 8:
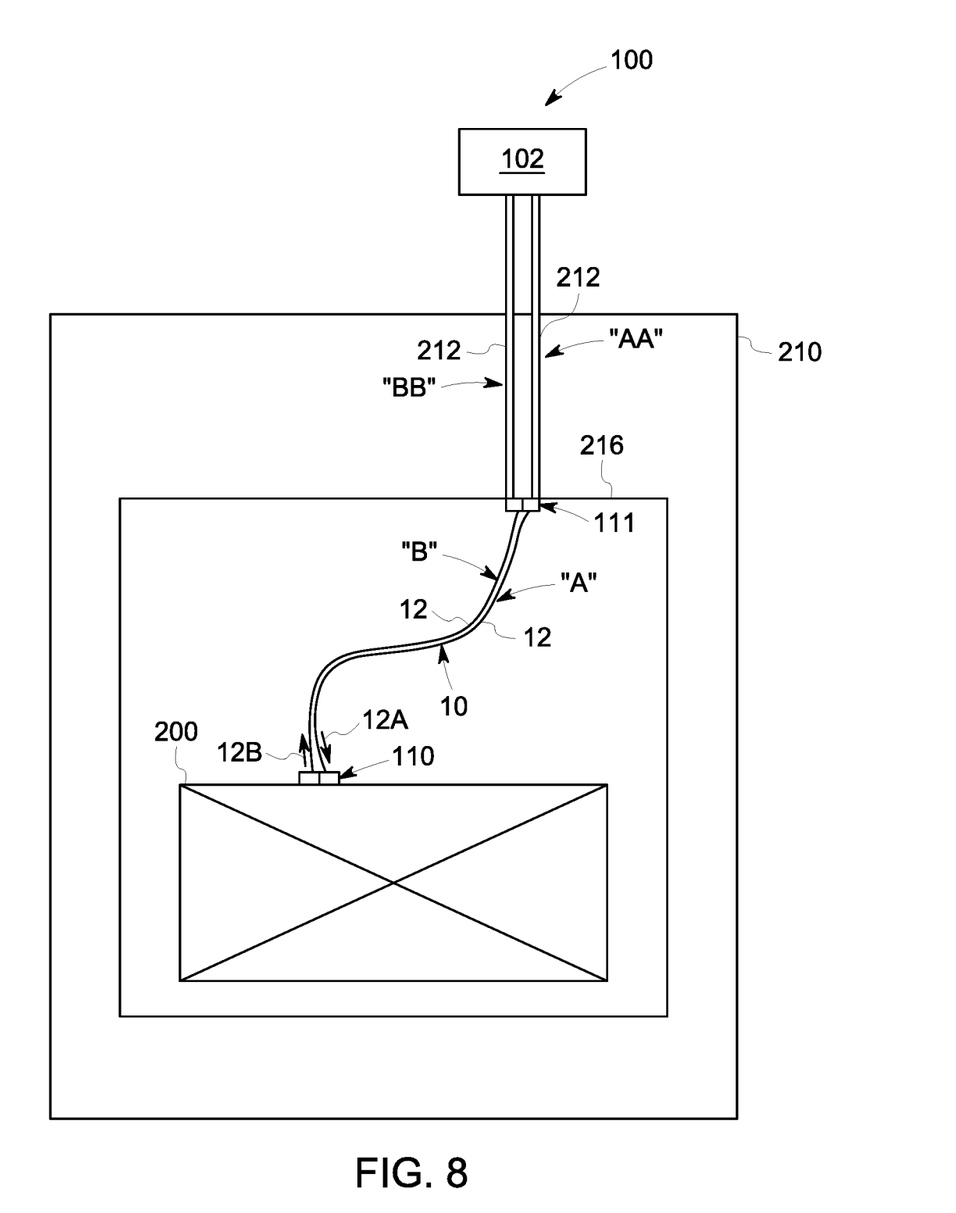
FIG. 8 is a schematic design illustrating a cryogenic system having a conductive lead assembly.

FIG. 8 illustrates additional features of a cryogenic system 100 including superconducting lead assembly 10. Cryogenic system 100 can include a power supply 102 at room temperature. Power supply 102 can supply power to cryogenic apparatus 200 disposed with a vessel 210 which can be provided by a vacuum vessel. Cryogenic apparatus 200 can include e.g. one or more of a superconducting magnet, motor, generator, fault current limiter, energy storage device, particle accelerator, middle scale magnet, lab use magnet, or transformer. Cryogenic system 100 can circulate a cryogenic fluid for cooling of cryogenic apparatus 200.

Power can be supplied to cryogenic apparatus 200 by inflow and outflow conductive paths provided by superconducting wires 12 as set forth herein in combination with power conductors 212. An inflow conductive path can be provided by power conductor 212 at "AA" in combination with a superconducting wire 12 at "A". An outflow conductive path can be provided by superconducting wire 12 at "B" in combination with power conductor 212 at "BB".

Power conductors 212 can be provided by metal, e.g. copper power conductors and can extend from power supply 102 into an interior of vessel 210. Vessel 210 can include a thermal barrier 216. In one embodiment, thermal barrier 216 can have a temperature in the temperature range of about 30° K to about 80° K and cryogenic apparatus 200 can have a temperature in the temperature range of from about 4° K to about 10° K. Superconducting lead assembly 10 can extend from current terminal assembly 111 of thermal barrier 216. Superconducting lead assembly 10 can extend to a cold area of a cryogenic system 100, e.g. to cryogenic apparatus 200 from a relatively warmer area, e.g. from thermal barrier 216, accordingly the first end of superconducting lead assembly 10 can be regarded as a cold side of superconducting lead assembly 10 and the second end of superconducting lead assembly 10 can be regarded as a warm side of superconducting lead assembly 10.

Superconducting lead assembly 10 can include a positive superconducting wire 12 at "A" for supplying current to cryogenic apparatus 200 (via path 12A) and a negative superconducting wire 12 at "B" for carrying current away from a cryogenic apparatus 200 (via path 12B). Superconducting lead assembly 10 can connect to current terminal assembly 110 of cryogenic apparatus 200.

In one aspect, as set forth in reference to FIGS. 1-7, superconducting lead assembly 10 can be configured to be flexible throughout its length. Superconducting lead assembly 10 can be configured to be flexible throughout its length in one embodiment by being absent of a rigid support structure opposing iterative movement of superconducting wires attributable to electromagnetic forces. For avoiding use of a rigid support structure to oppose iterative movement of one or more superconducting wire attributable to electromagnetic forces a positive superconducting wire 12 at "A" and a negative superconducting wire 12 at "B" can be provided to be in close proximity to one another and can be symmetrically disposed about an electrically insulating separator 14 which can be centrally located in respect to superconducting wires 12. Placement of the superconducting wires 12 as described can cause electromagnetic forces otherwise yielding iterative movement of one or more superconducting wire 12 to cancel thus avoiding reliance on a rigid support structure to oppose iterative movement configured as described herein. During operation superconducting lead assembly 10 can be in a bended state as indicated in FIG. 8 but can remain stationary in a bended state e.g. is not subject to iterative movement resulting from electromagnetic forces attributable to current flow. During operation superconducting lead assembly 10 is not subject to iterative movement by virtue of spacing coordination between superconducting wire 12 at "A"' and superconducting wire 12 at "B" yielding cancellation of electromagnetic forces.

In one embodiment vessel 210 can define a vacuum vessel in which case superconducting wires 12 of superconducting lead assembly 10 are not susceptible to being cooled by circulating vapors within vessel 210. Configuring superconducting lead assembly 10 to be flexible throughout its length facilitates elongation of the superconducting lead assembly 10 at low cost e.g. without re-design or with reduced re-design of fixed position system components of cryogenic system 100. Providing superconducting lead assembly 10 to be longer can reduce the introduction of heat into cryogenic apparatus 200 from superconducting lead assembly 10 which as noted in some embodiments can include thermally conductive material.

Further aspects and advantages are described with reference to the following example described in reference to FIGS. 9-11 wherein cryogenic system 100 is provided by a magnetic resonance imaging (MRI) system.

Figure 9:
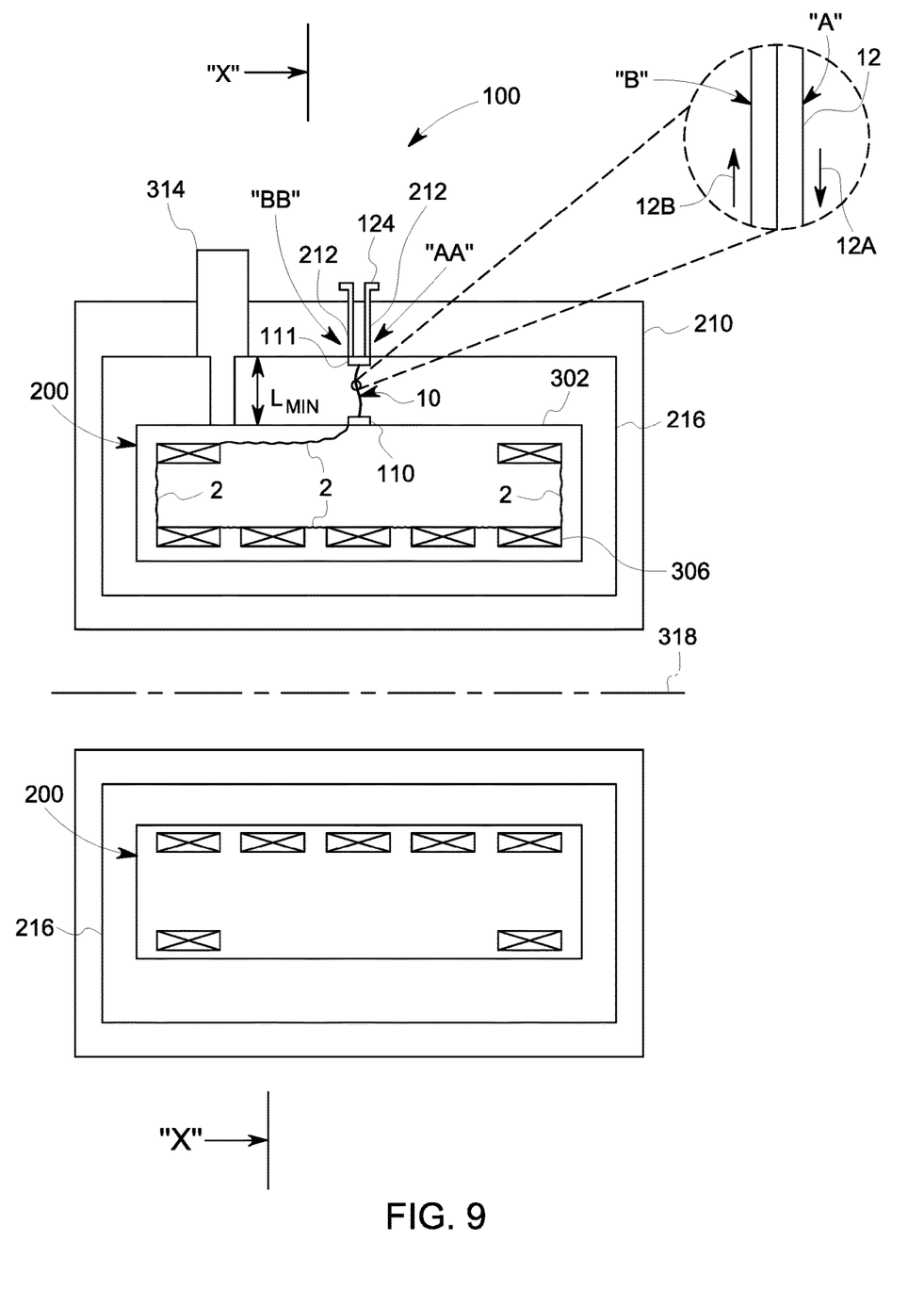
FIG. 9 is a side cut away view illustrating a cryogenic system provided by a magnetic resonance imaging system according to one embodiment.
Figure 10:
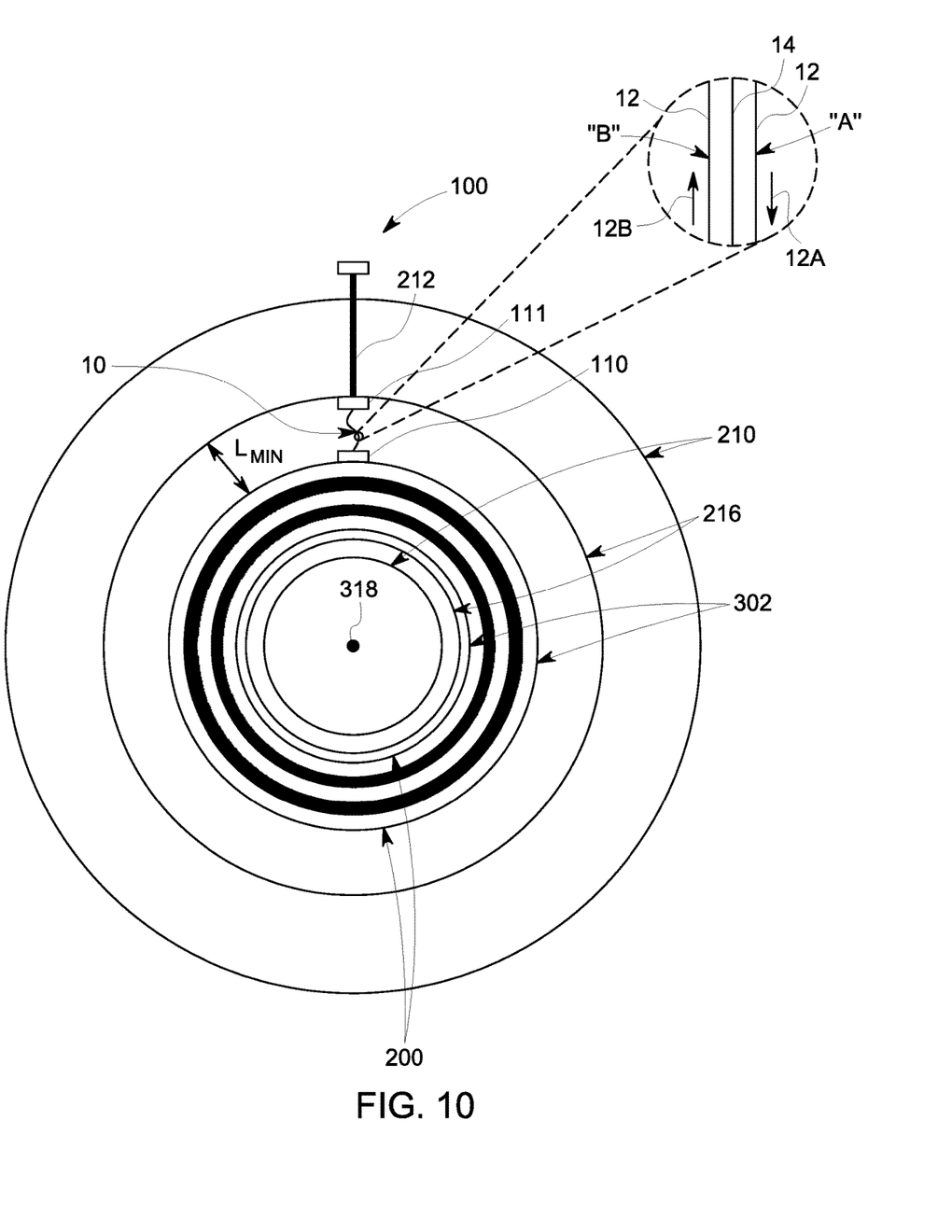
FIG. 10 is a front cross sectional view taken along line X-X of FIG. 9 illustrating a cryogenic system provided by a magnetic resonance imaging system according to one embodiment.
Figure 11:
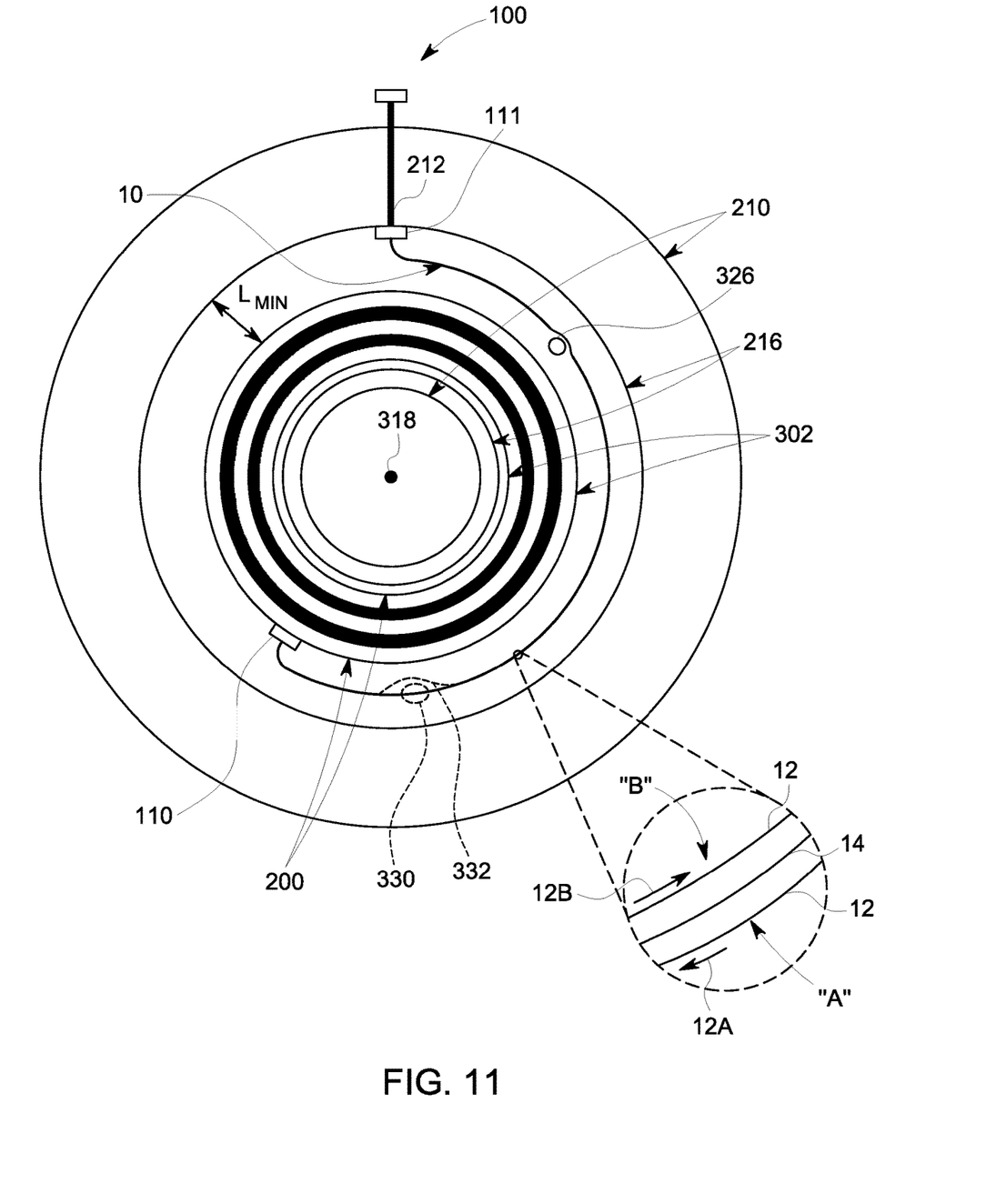
FIG. 11 is a front cross sectional view taken along line X-X of FIG. 9 illustrating a cryogenic system provided by a magnetic resonance imaging system according to one embodiment.

A cryogenic system 100 provided by an MRI system is shown in the cross sectional side view of FIGS. 9-11. Cryogenic system 100 can include a cryogenic apparatus 200 provided by a superconducting magnet. Cryogenic apparatus 200 provided by a superconducting magnet as shown in the embodiment of FIGS. 9-11 can include and can be defined and delimited by a cryogenic vessel 302. Cryogenic vessel 302 in the embodiment of FIGS. 9-11 can be in the form of a cylindrical annulus and can be disposed about central axis 318. Disposed within cryogenic vessel 302 and further defining a superconducting magnet can be a plurality of superconducting coils 306. Vessel 210 in the embodiment of FIGS. 9-11 can be provided by a vacuum vessel. Within vessel 210, there can be provided a thermal barrier 216 which in the embodiment of FIGS. 9-11 can be provided by a thermal shield plate.

Cryogenic vessel 302 defining a superconducting magnet can be in fluid communication with refrigerator 314 for circulating cooling fluid through cryogenic vessel 302. The superconducting coils 306 as shown in FIGS. 9-11 can be cooled by the cryogen, for example liquid helium, contained in the cryogenic vessel 302. Cryogenic vessel 302 can be cooled so that thermal barrier 216 exhibits a temperature in the temperature range of from about 30° K to about 80° K and so that cryogen apparatus 200 defined by cryogenic vessel 302 exhibits a temperature in the temperature range of from about 4° K to about 10° K. In other embodiments, the cryogenic vessel 302 used for cooling of superconducting coils 306 can be removed, or other kinds of direct-conduction refrigerating means may be used as the cooling apparatus to refrigerate the superconducting coils 306 to an operating cryogenic temperature.

Power can be supplied to cryogenic apparatus 200 by inflow and outflow conductive paths provided by superconducting wires 12 as set forth herein in combination with power conductors 212. An inflow conductive path can be provided by power conductor 212 at "AA" in combination with a superconducting wire 12 at "A". An outflow conductive path can be provided by power conductor 212 at "BB" in combination with a superconducting wire 12 at "B".

Power conductors 212 can be provided by metal power conductors and can extend from power supply 102 (FIG. 8) into an interior of vessel 210. Vessel 210 in one embodiment can be provided by a vacuum vessel. Superconducting lead assembly 10 can extend to a cold area of a cryogenic system 100, e.g. to cryogenic apparatus 200 from a relatively warmer area, e.g. from thermal barrier 216. Accordingly the first end of superconducting lead assembly 10 can be regarded as a cold side of superconducting lead assembly 10 and the second end of superconducting lead assembly 10 can be regarded as a warm side of superconducting lead assembly 10.

Superconducting wires 12 can extend from thermal barrier 216 to cryogenic apparatus 200. Superconducting wire 12 can be included in a superconducting lead assembly 10 as set forth herein. Superconducting wire 12 can include a positive superconducting wire 12 at "A" for supplying current to cryogenic apparatus 200 and a negative superconducting wire 12 at "B" for carrying current away from a cryogenic apparatus 200 (via path 12B).

In one embodiment, providing superconducting wires 12 to include high temperature superconducting (HTS) material can assure that superconducting wires 12 remain superconducting when disposed between thermal barrier 216 and cryogenic apparatus 200. As noted HTS material in one embodiment can have a critical temperature ($T_C$) of about 90° K or higher, and the area thermal barrier 216 and cryogenic apparatus 200 can have a temperature in the temperature range of from about 80° K to about 4° K (Cryogenic vessel 302 can be cooled so that thermal barrier 216 exhibits a temperature in the temperature range of from about 30° K to about 80° K and so that cryogen apparatus 200 defined by cryogenic vessel 302 exhibits a temperature in the temperature range of from about 4° K to about 10° K). Embodiments herein recognize that when operating precisely at a critical temperature ($T_C$) a superconducting material may not optimally pass current and can be susceptible to being effected by a background magnetic field. Embodiments herein recognize that operation of superconducting lead assembly 10 can be improved by providing superconducting lead assembly 10 to include an operating regime margin. In one embodiment, superconducting lead assembly 10 can be provided so that superconducting material of superconducting wires 12 has a critical temperature ($T_C$) in excess an expected environment operating temperature. Providing superconducting wires 12 to include superconducting material, e.g. HTS material, having a critical temperature ($T_C$) in excess an expected operating temperature can improve current carrying capacity of superconducting wires 12. Providing superconducting wires 12 to include superconducting material, e.g. HTS material, having critical temperature ($T_C$) in excess an expected operating temperature can reduce an effect of a magnetic field on superconducting wires 12. In one embodiment superconducting lead assembly 10 can be provided so that superconducting wires 12 include a superconducting material critical temperature ($T_C$) of at least 5° K greater than a warmest environmental operating temperature. In one embodiment superconducting lead assembly 10 can be provided so that superconducting wires 12 include a superconducting material critical temperature ($T_C$) of at least 10° K greater than a warmest environmental operating temperature. In one embodiment superconducting lead assembly 10 can be provided so that superconducting wires 12 include a superconducting material critical temperature ($T_C$) of at least 20° K greater than a warmest environmental operating temperature.

A first end of superconducting lead assembly 10 can be connected to a first current terminal assembly 110 included on cryogenic apparatus 200. First current terminal assembly 110 can be included on cryogenic vessel 302 defining cryogenic apparatus 200. Positive superconducting wire 12 carrying an electrical current toward cryogenic apparatus 200 e.g. along path 12A, can be connected to an inflow current terminal of first current terminal assembly 110 and negative superconducting wire 12 which can carry current e.g. along path 12B away from cryogenic apparatus 200 can be connected to an outflow current terminal of first current terminal assembly 110.

A second end of superconducting lead assembly 10 can be connected to a second current terminal assembly 111 included as part of a component within vessel 210 at a warmer area of cryogenic system 100 than cryogenic apparatus 200. Second current terminal assembly 111 can be included on a thermal barrier 216 which can be provided by a thermal shield plate. Positive superconducting wire 12 at "A" carrying an electrical current away from current terminal assembly 111 e.g. along path 12A to cryogenic apparatus 200, can be connected to an outflow current terminal of current terminal assembly 111 and negative superconducting wire 12 at 'B" which can carry current e.g. along path 12B to current terminal assembly 111 away from cryogenic apparatus 200 can be connected to an inflow current terminal of current terminal assembly 111.

During a superconducting magnet ramp-up process, an external power supply 102 (FIG. 8) can provide power to superconducting coils 306 through inflow and outflow conductive paths provided by power conductors 212 and superconducting wires 12 and wiring 2 for conducting current between superconducting coils 306 within cryogenic vessel 302. Once the superconducting coils 306 are energized to pre-determined current and magnetic field, a main superconducting switch can be closed to establish a closed superconducting loop with the superconducting coils 306. Therefore, a magnetic field can be generated in a magnetic field area by the superconducting coils 306.

FIGS. 9-11 illustrate features of superconducting lead assembly 10 in use to provide energizing of a superconducting magnet having superconducting coils 306 disposed within cryogenic vessel 302.

Current terminal assembly 111 can be included on thermal barrier 216 provided by a thermal plate shield in the embodiment of FIG. 9-11. Current terminal assembly 110 can be included at cryogenic apparatus 200 provided by a superconducting magnet in the embodiment of FIG. 9-11. Superconducting lead assembly 10 as shown in FIGS. 1-7 can be connected between current terminal assembly 110 and current terminal assembly 111 and can extend within vessel 210 which can define a vacuum.

As indicated in FIGS. 9-11, a minimal spacing distance $L_{MIN}$ between thermal barrier 216 and can be given as indicated in FIGS. 9-11 which is a distance along a diameter extending through central axis 318. In the arrangement depicted in FIG. 10, the length of superconducting lead assembly 10 is similar the length $L_{MIN}$, the minimal spacing distance between thermal barrier 216 which can be provided by a thermal shield plate and cryogenic apparatus 200. Yet, in the embodiments of FIG. 10 superconducting lead assembly 10 can be advantageously bended as shown e.g. to facilitate connection without requiring tight tolerances by virtue of it being flexible throughout its length. During operation superconducting lead assembly 10 can be in a bended state as indicated in FIGS. 8-11 but can remain stationary in a bended state e.g. is not subject to iterative movement resulting from electromagnetic forces attributable to current flow. During operation superconducting lead assembly 10 is not subject to iterative movement by virtue of spacing coordination between superconducting wire 12 at "A" and superconducting wire 12 at "B" yielding cancellation of electromagnetic forces.

Referring now to the arrangement shown in FIG. 11, an alternative arrangement for superconducting lead assembly 10 is illustrated.

In the arrangement depicted in FIG. 11, current terminal assembly 110 having inflow and outflow current terminals is included on cryogenic apparatus 200 at a point that does not oppose current terminal assembly 111 at thermal barrier 216, but rather is included on cryogenic apparatus 200 at a point that is offset from current terminal assembly 111. In the embodiment of FIG. 11 current terminal assembly 111 of thermal barrier 216 can be disposed at 12 O'Clock and current terminal assembly 110 of cryogenic apparatus 200 can be disposed at 7 O'Clock. Accordingly, in the embodiment shown in FIG. 11, superconducting lead assembly 10 can feature a length, L, far in excess of the minimal spacing distance as depicted in FIGS. 9-11, which is the minimal spacing distance between thermal barrier 216 and cryogenic apparatus 200. That is, in the embodiment of FIG. 11, $L >> L_{MIN}$. The embodiment of FIG. 11 features various advantages. For example, while superconducting lead assembly 10 can be provided to be superconducting by the selection of material of superconducting layer 1202 as depicted in FIGS. 2-4, superconducting lead assembly 10 e.g. by the inclusion of protective layer 1208 can be expected to exhibit some measure of thermal conductivity which can be deleterious to the operation of cryogenic apparatus 200 by the conduction of heat into cryogenic apparatus 200. In one embodiment $L_{11}$ can be $1.5 \times L_{MIN}$ or longer. In one embodiment $L_{11}$ can be $2 \times L_{MIN}$ or longer. In one embodiment $L_{11}$ can be $3 \times L_{MIN}$ or longer. In one embodiment $L_{11}$ can be $5 \times L_{MIN}$ or longer. In one embodiment $L_{11}$ can be $10 \times L_{MIN}$ or longer.

To reduce the effect of thermal conductivity, if heat may be input into cryogenic apparatus 200 by superconducting lead assembly 10, a substantial length for superconducting lead assembly 10 as shown in FIG. 11 can be advantageous, e.g. can limit conduction of heat to cryogenic apparatus 200. An amount of heat input into cryogenic apparatus 200 can be reduced as the length of superconducting lead assembly 10 is increased as shown in the embodiment of FIG. 11, relative to the embodiment of FIG. 10. Superconducting lead assembly 10 as set forth herein can be flexible throughout its length. Accordingly, installation options for the installation of superconducting lead assembly 10 into vessel 210 are available. That is, superconducting lead assembly 10 can be installed into vessel 210 as depicted in FIGS. 8-11 in the area between thermal barrier 216 and cryogenic apparatus without complex mounting apparatus or tolerance requirements between opposing surfaces which may be used in an alternative embodiment wherein superconducting lead assembly 10 is not provided in a flexible form (e.g. includes rigid support structure to oppose electromagnetic force induced iterative movement).

In the embodiments as shown in FIGS. 8-11, superconducting lead assembly 10 includes a positive superconducting wire 12 carrying inflow current into cryogenic apparatus 200 and a negative superconducting wire 12 carrying outflow current away from cryogenic apparatus 200. In an alternative embodiment, a first superconducting lead assembly having a single superconducting wire 12 can be operative to carry inflow current to cryogenic apparatus 200 and a second, spaced apart superconducting lead assembly also having a single superconducting wire 12 can be disposed to carry outflow current from cryogenic apparatus 200. While the alternative embodiment described having separate lead assemblies for inflow and outflow current can be advantageous in some respects, such alternative embodiment can feature disadvantages. Embodiments herein recognize that in the separate lead assembly for inflow and outflow current configuration Lorentz forces can be operative to cause iterative movement of superconducting wire 12 and instability of a current carrying superconducting wire 12. To counteract Lorentz force instability, a rigid support structure may be included in a conductive lead assembly including a superconducting wire such as superconducting wire 12 to prevent bending thereof.

Embodiments herein recognize that the use of a rigid support structure for opposing unwanted iterative bending of a length of superconducting wire such as superconducting wire 12 can feature disadvantages namely, higher parts costs e.g. the cost of a rigid support structures and also additional design costs e.g. if rigid lead assemblies characterized by having rigid support structures are used cryogenic system 100 can feature increased design tolerances e.g. opposing or coordinated surfaces within cryogenic vessel 302 may be required to permit connecting of a rigid superconducting lead assembly between fixed points of a cryogenic system 100. Rather than rely on a rigid support structure to counteract Lorentz forces, superconducting lead assembly 10 counteracts Lorentz forces by providing a positive superconducting wire 12 at "A" for carrying inflow current and a negative superconducting wire 12 at "B" for simultaneously carrying outflow current so that Lorentz forces are offset. A flexible superconducting lead assembly 10 as shown in FIGS. 8-11, avoids a need for a rigid support structure for opposing bending of a superconducting wire to counteract Lorentz forces. Superconducting lead assembly 10 can be configured so that Lorentz forces attributable to positive superconducting wire 12 and negative superconducting wire 12 conducting can be offset. Superconducting lead assembly 10 can increase system simplicity and decrease costs associated with design of cryogenic system 100 and installation of superconducting lead assembly 10 within vessel 210.

There is set forth a method including installing a superconducting lead assembly 10 within a vessel 210 of a cryogenic system 100 having a cryogenic apparatus 200, the superconducting lead assembly 10 having a positive superconducting wire 12 and a negative superconducting wire 12, wherein the positive superconducting wire 12 is configured to conduct inflow current to a cryogenic apparatus 200 and wherein the negative superconducting wire 12 is configured to conduct outflow current away from the cryogenic apparatus 200, and an electrically insulating separator 14, wherein the positive superconducting wire 12 and the negative superconducting wire 12 are arranged proximately one another about the electrically insulating separator 14 for cancellation of electromagnetic forces attributable to current flowing simultaneously in opposite directions within the positive superconducting wire 12 and the negative superconducting wire 12, wherein a length of the superconducting lead assembly 10 is flexible, wherein the installing includes connecting the superconducting lead assembly to the cryogenic apparatus 200 for supply of current from a power supply 102 (FIG. 8) to the cryogenic apparatus 200 and bending the superconducting lead assembly 10 into a bended configuration. For example, referring to FIG. 11 superconducting lead assembly 10 can be bended in a bended configuration as shown in FIG. 11 so that it can form a generally circular configuration about central axis 318 and further to permit routing to avoid fixed position feature 326 of cryogenic system 100.

There is set forth a method including supplying power from the power supply 102 (FIG. 8) to energize the cryogenic apparatus 200 using the superconducting lead assembly 10, the supplying power including simultaneously conducting inflow current through the positive superconducting wire 12 at "A" and outflow current through the negative superconducting wire 12 at "B".

There is also set forth herein subsequently to the supplying power re-bending the superconducting lead assembly 10 so that the superconducting lead assembly is in a second bended configuration and re-supplying power from the power supply 102 (FIG. 8) to energize the cryogenic apparatus 200 using the superconducting lead assembly 10, the re-supplying power including simultaneously conducting inflow current through the positive superconducting wire 12 at "A" and outflow current through the negative superconducting wire 12 at "B", wherein the re-supplying power is characterized by the superconducting lead assembly 10 remaining stationary in the second bended configuration by operation of electromagnetic forces attributable to current flowing simultaneously in opposite directions within the positive superconducting wire 12 at "a" and the negative superconducting wire 12 at "B" cancelling one another. For example, after an initial routing of superconducting lead assembly 10, it may be desirable to re-route and re-bend superconducting lead assembly 10 into a second bended configuration. For example a design requirement or identified issue (e.g. for improved field generation) may make it advantageous to avoid routing coincident with area 330 (FIG. 11) in which case superconducting lead assembly 10 can simply be re-bended into a second bended configuration in which superconducting lead assembly 10 is re-routed and extends along and alternate path that includes alternate path segment 332 to avoid area 330 (FIG. 11).

This written description uses examples to disclose the invention, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Forms of term "based on" herein encompass relationships where an element is partially based on as well as relationships where an element is entirely based on. Forms of the term "defined" encompass relationships where an element is partially defined as well as relationships where an element is entirely defined. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure. It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the disclosure may include only some of the described embodiments. Accordingly, the invention is not to be seen as limited by the foregoing description, but is only limited by the scope of the appended claims.

The invention claimed is:

1. A cryogenic system comprising:
a vessel containing a cryogenic apparatus; and
a superconducting lead assembly feeding electric current from a power supply to the cryogenic apparatus and extending from an area of the cryogenic system to the cryogenic apparatus, the area warmer than the cryogenic apparatus, the superconducting lead assembly having a positive superconducting wire disposed within the vessel and a negative superconducting wire disposed within the vessel, wherein the positive superconducting wire is an inflow superconducting wire conducting inflow current to the cryogenic apparatus and wherein the negative superconducting wire is an outflow superconducting wire conducting outflow current away from the cryogenic apparatus, wherein the superconducting lead assembly includes an electrically insulating separator, and wherein the positive superconducting wire and the negative superconducting wire are arranged proximate one another and disposed on opposite sides of the electrically insulating separator to cancel electromagnetic forces attributable to current flowing simultaneously in opposite directions within the positive superconducting wire and the negative superconducting wire, and wherein a length of the superconducting lead assembly is flexible.

2. The system of claim 1, wherein positive superconducting wire and the negative superconducting wire include high temperature superconducting (HTS) material.

3. The system of claim 1, wherein the vessel is a vacuum vessel.

4. The system of claim 1, wherein the positive superconducting wire and the negative superconducting wire are symmetrically disposed about the electrically insulating separator.

5. The system of claim 1, wherein the positive superconducting wire, the negative superconducting wire and the electrically insulating separator are each of an elongated configuration.

6. The system of claim 1, wherein the superconducting lead assembly is flexible throughout a length thereof.

7. The system of claim 1, wherein the positive superconducting wire and the negative superconducting wire include respective superconducting layers and substrates, wherein the superconducting lead assembly is configured so that the respective superconducting layers of the positive superconducting wire and negative superconducting wire are disposed closer to the electrically insulating separator than the respective substrates of the positive superconducting wire and negative superconducting wire.

8. The system of claim 1, wherein the superconducting lead assembly is in a bended configuration within the vessel.

9. The system of claim 1, wherein the superconducting lead assembly has a first end connected to a current terminal assembly of the cryogenic apparatus, and a second end connected to a current terminal assembly of a component of the cryogenic system disposed within the vessel, the cryogenic apparatus being colder than the component.

10. The system of claim 1, wherein the cryogenic apparatus includes one or more of the following selected from the group consisting of a superconducting magnet, motor, generator, fault current limiter, energy storage device, particle accelerator, middle scale magnet, lab use magnet, and transformer.

11. The system of claim 1, wherein the superconducting lead assembly extends from a thermal barrier to the cryogenic apparatus.

12. The system of claim 1, wherein the superconducting lead assembly is absent a rigid support structure to oppose iterative movement of a superconducting wire resulting from electromagnetic forces attributable to current flowing through a superconducting wire.

13. The system of claim 1, wherein the positive superconducting wire includes superconducting material, the superconducting material being selected from the group consisting of copper oxide superconducting material and rare earth superconducting material.

14. The system of claim 1, wherein the positive superconducting wire includes a superconducting layer formed of superconducting material, and non-superconducting material formed around the superconducting layer.

15. A method comprising:
installing a superconducting lead assembly within a vessel of a cryogenic system having a cryogenic apparatus, the superconducting lead assembly extending from an area of the cryogenic system to the cryogenic apparatus, the area warmer than the cryogenic apparatus, the superconducting lead assembly having a positive superconducting wire and a negative superconducting wire, wherein the positive superconducting wire is configured to conduct inflow current to a cryogenic apparatus and wherein the negative superconducting wire is configured to conduct outflow current away from the cryogenic apparatus, and an electrically insulating separator, wherein the positive superconducting wire and the negative superconducting wire are arranged proximate one another about the electrically insulating separator for cancellation of electromagnetic forces attributable to current flowing simultaneously in opposite directions within the positive superconducting wire and the negative superconducting wire, wherein a length of the superconducting lead assembly is flexible, wherein the installing includes connecting the superconducting lead assembly to the cryogenic apparatus for supply of current from a power supply to the cryogenic apparatus and bending the superconducting lead assembly into a bended configuration; and
supplying power from the power supply to energize the cryogenic apparatus using the superconducting lead assembly, the supplying power including simultaneously conducting inflow current through the positive superconducting wire and outflow current through the negative superconducting wire.

16. The method of claim 15, wherein positive superconducting wire and the negative superconducting wire include high temperature superconducting (HTS) material.

17. The method of claim 15, wherein the supplying power is characterized by the superconducting lead assembly remaining stationary in the bended configuration by operation of electromagnetic forces attributable to current flowing simultaneously in opposite directions within the positive superconducting wire and the negative superconducting wire cancelling one another.

18. The method of claim 15, wherein the method includes subsequently to the supplying power re-bending the superconducting lead assembly so that the superconducting lead assembly is in a second bended configuration and re-supplying power from the power supply to energize the cryogenic apparatus using the superconducting lead assembly, the re-supplying power including simultaneously conducting inflow current through the positive superconducting wire and outflow current through the negative superconducting wire, wherein the re-supplying power is characterized by the superconducting lead assembly remaining stationary in the second bended configuration by operation of electromagnetic forces attributable to current flowing simultaneously in opposite directions within the positive superconducting wire and the negative superconducting wire cancelling one another.

* * * * *